(12) United States Patent
Mei et al.

(10) Patent No.: US 8,860,529 B2
(45) Date of Patent: Oct. 14, 2014

(54) IMPEDANCE TRANSFORMING COUPLER

(75) Inventors: Chong Mei, Jamesville, NY (US); Hans P. Ostergaard, Viborg (DK)

(73) Assignee: Anaren, Inc., East Syracuse, NY (US)

( * ) Notice: Subject to any disclaimer, the term of this patent is extended or adjusted under 35 U.S.C. 154(b) by 473 days.

(21) Appl. No.: 13/229,254

(22) Filed: Sep. 9, 2011

(65) Prior Publication Data
US 2012/0229230 A1 Sep. 13, 2012

Related U.S. Application Data

(60) Provisional application No. 61/381,769, filed on Sep. 10, 2010.

(51) Int. Cl.
  *H01P 5/18* (2006.01)
  *H03F 1/02* (2006.01)
  *H03F 3/60* (2006.01)
(52) U.S. Cl.
  CPC ............. *H01P 5/187* (2013.01); *H03F 1/0288* (2013.01); *H03F 3/602* (2013.01)
  USPC ............................ 333/116; 333/109; 333/124

(58) Field of Classification Search
  USPC .................................. 333/109, 115–118, 124
  See application file for complete search history.

(56) References Cited

U.S. PATENT DOCUMENTS

| | | | |
|---|---|---|---|
| 5,307,032 A * | 4/1994 | Uno | .............................. 333/101 |
| 6,922,102 B2 | 7/2005 | Myer et al. | |
| 7,064,606 B2 | 6/2006 | Louis | |
| 7,148,746 B2 | 12/2006 | Louis | |
| 7,362,170 B2 | 4/2008 | Louis | |
| 2009/0295497 A1 | 12/2009 | Dowling | |

* cited by examiner

*Primary Examiner* — Robert Pascal
*Assistant Examiner* — Kimberly Glenn
(74) *Attorney, Agent, or Firm* — George R. McGuire; Bond Schoeneck & King, PLLC

(57) ABSTRACT

A coupler circuit that includes two parallel coupled transmission lines (first transmission line and second transmission line) and a third transmission line, one end of the third transmission line connects to the end of first transmission line at one side, the other end of the third transmission line connects to the end of the second transmission line at the other side. Various coupling value and impedance transforming ratio can be achieved by select corresponding even and odd mode impedance of the coupled transmission lines and characteristic impedance of the crossing transmission line.

6 Claims, 9 Drawing Sheets

IMPEDANCE TRANSFORMING COUPLER

CROSS REFERENCE TO RELATED APPLICATION

The present application claims priority to applicant's U.S. Provisional Application Ser. No. 61/381,769, filed on Sep. 10, 2010, the entirety of which is incorporated by reference.

BACKGROUND OF THE INVENTION

1. Field of the Invention

The present invention relates generally Microwave/RF transmission hardware and more specifically to a coupler that transforms impedance as between its first side port(s) and second side port(s).

2. Description of the Related Art

A 90 degree 3 decibel (dB) hybrid coupler is a passive four-port device. A coupler has four ports: input, transmitted, coupled, and isolated. In a signal-dividing operation, the coupler divides an incident signal (for example, radio frequency (RF) signal or microwave frequency signal) at the input port into two signals paths, one output at the transmitted port and the other output at the coupled port. The signals at the transmitted port and at the coupled port are of equal amplitude and have a relative 90 degree phase difference. As a reciprocal device, the coupler can also combine two signals that are 90 degrees apart in phase. In a combining operation transmitted port and coupled port output that combined signal at the input port. The splitting and recombining properties make the hybrid couplers useful in a wide range of RF circuits, such as low noise amplifier, power amplifier, attenuator, mixers and so on.

Typically, all four ports of the coupler have the same port impedance which is matched to whatever standard RF system impedance is being used in a given system (usually 50 ohms or 75 ohms). The impedance of the circuits in the previous stage and the next stage also need to match to the system impedance, in order to maximize the power transfer through the coupler. For example, in power amplifier design, output matching circuit is essential to transform a typical low impedance of the transistor to the system impedance (usually, 50 ohms or 75 ohms). The impedance transformation is conventionally realized by electrically connecting at least one set of ports of the coupler to extraneous circuit elements. These extraneous circuit elements used to match impedance may be: (i) lumped elements, such as inductors and capacitors, and/or (ii) distributed elements, such as quarter-wavelength transmission lines. As a couple of preliminary notes on terminology: (i) any type of current carrier that acts as a transmission line will generally be herein referred to as a "transmission line; and (ii) a transmission line that has the form of a strip of conductive material will herein generally be called a "strip line" or a "strip transmission line; and (ii) for the most part these terms will be used interchangeably herein, even though they denote a genus (that is, transmission lines) and a species (that is, transmission strip lines). There are inevitably limitations on bandwidth, insertion loss, layout area and cost associated with these extraneous output matching circuits. Generally speaking, the higher the impedance transform ratio that is required, the more performance of the coupler circuitry is degraded.

The difficulty of these matching circuits can be alleviated, if the coupler is structured to have an impedance transforming function. Instead of directly matching to system impedance, a transforming coupler can transform the system impedance into an intermediate impedance first. The matching circuit of the previous or next stage then matches to this intermediate impedance instead of to the system impedance. Choosing the proper intermediate impedance can lower the required impedance transform ratio. This results in the design simplification and/or performance improvement of the matching circuits, as well as size and cost reduction.

As an example of a conventional couple having an impedance transforming function, patent application Publication No: US 2009/0295497 ("497 Dowling") discloses an impedance transforming hybrid coupler that is realized by cascading two impedance transforming circuits in series with output ports of a conventional hybrid coupler, and integrating these separated function blocks into same package, as shown in 497 Dowling at its FIG. 1. The drawbacks of this solution are increased insertion loss and increased circuit size due to the inserted impedance transforming in the couplers of 497 Dowling.

The following published documents may also include helpful background information: (i) U.S. Pat. No. 6,922,102 ("102 Myer"); (ii) U.S. Pat. No. 7,064,606 ("606 Louis"); (iii) U.S. Pat. No. 7,148,746 ("746 Louis"); and/or (iv) U.S. Pat. No 7,362,170 ("Louis").

Description Of the Related Art Section Disclaimer: To the extent that specific publications are discussed above in this Description of the Related Art Section, these discussions should not be taken as an admission that the discussed publications (for example, published patents) are prior art for patent law purposes. For example, some or all of the discussed publications may not be sufficiently early in time, may not reflect subject matter developed early enough in time and/or may not be sufficiently enabling so as to amount to prior art for patent law purposes. To the extent that specific publications are discussed above in this Description of the Related Art Section, they are all hereby incorporated by reference into this document in their respective entirety(ies).

BRIEF SUMMARY OF THE INVENTION

At least some embodiments of the present invention are directed to a four port coupler where the two ports a of port pair (that is, the input/isolated port pair or the transmitted/coupled port pair) are electrically connected to each other with a crossing line. This crossing line does not necessarily directly mechanically connect to the ports, and will often be connected to current paths, within the four port coupler, that respectively lead to the ports of the connected port pair. While it may be possible to make a crossing line of the present invention using lines with lumped elements inserted into it, this is not necessarily preferred. Rather, in preferred embodiments, the crossing line will be a conduction path with a strip line inserted into it. If the transmission line is on the high impedance side, then it should preferably be $(\lambda/4)+n\lambda$ in length, where n is an odd integer (preferably 0) and $\lambda$ is the operational wavelength of the coupler. If the strip line is on the low impedance side, then it should preferably be $(3\lambda/4)+n\lambda$ in length, where n is an integer (preferably 0) and $\lambda$ is the operational wavelength of the coupler. In preferred embodiments of the present invention, the following characteristics of the coupler circuit are deigned to accomplish a relatively efficient impedance transformation: (i) odd mode impedance of the coupled lines of the coupler; (ii) even mode impedance of the coupled lines of the coupler; and (iii) impedance of the crossing line.

Some aspects of the present invention relate to a novel coupling structure with an intrinsic impedance transforming property. The impedance transforming property is characterized as "intrinsic" because it is accomplished by circuitry (for example, a crossing line with an inserted strip line) that is electrically connected within the four ports of the four port coupler. In other words, no extraneous circuitry must be connected outside of the four ports, such as the extraneous impedance transforming stage of 497 Dowling. The actual impedance adjusting means is inherently parallel to the overall structure and hence even reduces the insertion loss. At least some embodiments of the present invention are advantageous with respect to over insertion loss performance and reduced size.

According to one aspect of the present invention, a coupler circuit operates at at least a nominal operating frequency. The coupler circuit includes: a first port rated at a first impedance; a second port rated at a first impedance; a third port rated at a second impedance; a fourth port rated at the second impedance; a pair of coupled lines (including a first coupled line and a second coupled line); and crossing line circuitry (having a crossing line impedance). The first coupled line has a first end and a second end. The second coupled line has a first end and a second end. The crossing line circuitry has a first terminal and a second terminal. The first and second coupled lines have a geometry and spacing so that, at the nominal operating frequency, the first and second lines act as coupled line pair having an odd mode impedance and an even mode impedance. The first port is electrically connected to: (i) the first end of the first coupled line, and (ii) the first terminal of the crossing line circuitry. The second port is electrically connected to: (i) the second end of the second coupled line, and (ii) the second terminal of the crossing line circuitry. The third port is electrically connected to the first end of the second coupled line. The fourth port is electrically connected to the second end of the first coupled line. The odd mode impedance, the even mode impedance and the crossing line impedance are selected so that the coupler circuit transforms electrical signals, at the nominal operating frequency, between: (i) the first impedance, at the first and/or second ports, and (ii) the second impedance, at the third and/or fourth ports.

According to a further aspect of the present invention, a coupler circuit operates at at least a nominal operating frequency. The coupler circuit includes: a first port rated at a first impedance; a second port rated at a first impedance; a third port rated at a second impedance; a fourth port rated at the second impedance; a pair of coupled strip lines (including a first coupled strip line and a second coupled line); crossing line circuitry (including a strip transmission line and having a crossing line impedance; and a dielectric substrate. The first coupled strip line has a first end and a second end. The second coupled strip line has a first end and a second end. The crossing line circuitry has a first terminal and a second terminal. The first and second coupled strip lines have a geometry and spacing so that, at the nominal operating frequency, the first and second strip lines act as coupled line pair having an odd mode impedance and an even mode impedance. The first port is electrically connected to: (i) the first end of the first coupled strip line, and (ii) the first terminal of the crossing line circuitry. The second port is electrically connected to: (i) the second end of the second strip coupled line, and (ii) the second terminal of the crossing line circuitry. The third port is electrically connected to the first end of the second coupled strip line. The fourth port is electrically connected to the second end of the first coupled strip line. The odd mode impedance, the even mode impedance and the crossing line impedance are selected so that the coupler circuit transforms electrical signals, at the nominal operating frequency, between: (i) the first impedance, at the first and/or second ports, and (ii) the second impedance, at the third and/or fourth ports. The first and second coupled strip lines and the strip transmission lines are printed on the substrate.

According to a further aspect of the present invention, a coupler circuit operates at at least a nominal operating frequency and nominal operating wavelength. The coupler circuit includes: a first port rated at a high impedance; a second port rated at a high impedance; a third port rated at a low impedance; a fourth port rated at the low impedance; a pair of coupled lines (including a first coupled line and a second coupled line); and crossing line circuitry (including a first terminal, a strip transmission line and a second terminal). The crossing line circuitry has a crossing line impedance. The strip transmission line is one quarter wavelength in length. The first coupled line has a first end and a second end. The second coupled line has a first end and a second end. The first and second coupled lines have a geometry and spacing so that, at the nominal operating frequency, the first and second lines act as coupled line pair having an odd mode impedance and an even mode impedance. The first port is electrically connected to: (i) the first end of the first coupled line, and (ii) the first terminal of the crossing line circuitry. The second port is electrically connected to: (i) the second end of the second coupled line, and (ii) the second terminal of the crossing line circuitry. The third port is electrically connected to the first end of the second coupled line. The fourth port is electrically connected to the second end of the first coupled line. The odd mode impedance, the even mode impedance and the crossing line impedance are selected so that the coupler circuit transforms electrical signals, at the nominal operating frequency, between: (i) the high impedance, at the first and/or second ports, and (ii) the low impedance, at the third and/or fourth ports.

BRIEF DESCRIPTION OF THE DRAWINGS

The present invention will be more fully understood and appreciated by reading the following Detailed Description in conjunction with the accompanying drawings, in which.

DETAILED DESCRIPTION OF THE INVENTION

Figure 1A:
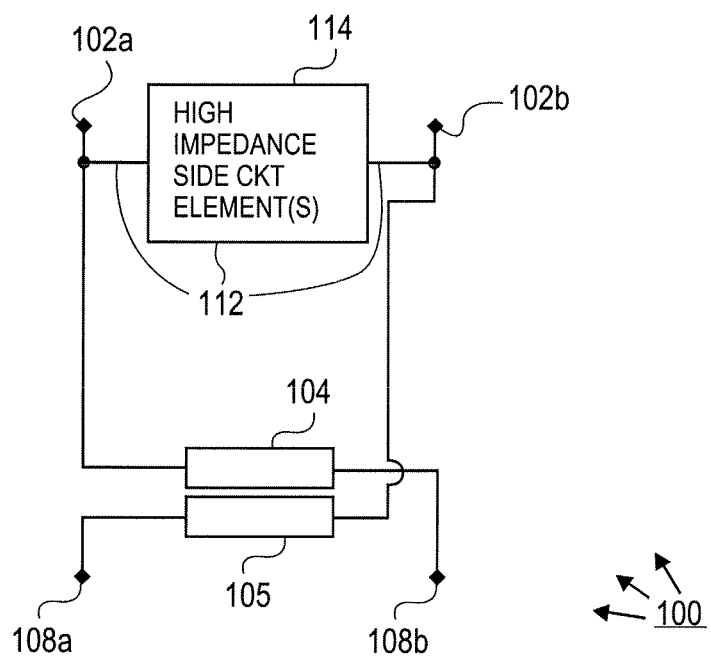
FIG. 1A is a schematic view of a first embodiment of a coupler according to the present invention.

As shown in FIG. 1A, coupler circuit 100 includes: high impedance side port pair 102 (including first high impedance side port 102a and second high impedance side port 102b); first coupled line 104; second coupled line 105; low impedance side port pair 108 (including first low impedance side port 108a and second low impedance side port 108b); and crossing line 112 (including high impedance side circuit elements 114). By connecting crossing line 112, with its high impedance side circuit elements 114) across the pair of high impedance ports, coupler 100 will have a high impedance at its high impedance port pair 102, while maintaining a relatively lower impedance at its low impedance port pair 108. The high impedance side circuit elements are chosen so that the impedance will be transformed between high and low when the coupler operates in a coupling mode and/or in a splitting mode.

Some specific examples of high impedance side circuit element(s) will be discussed below in connection with other embodiments. However, it is noted that the present invention is not necessarily limited to the preferred, specific high impedance side circuit element(s) specifically discussed below. The specific high impedance side circuit element(s) may include lumped circuit element(s) and/or distributed circuit element(s).

Figure 1B:
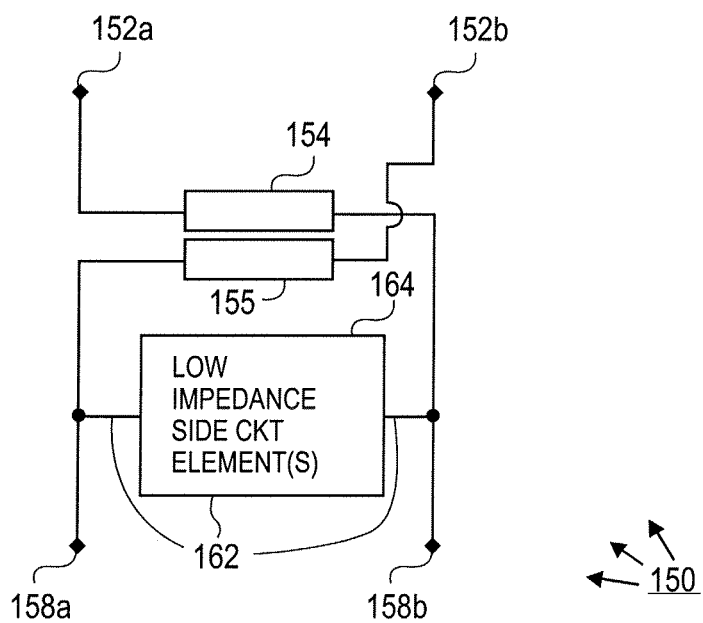
FIG. 1B is a schematic view of a second embodiment of a coupler according to the present invention.

As shown in FIG. 1B, coupler circuit 150 includes: high impedance side port pair 152 (including first high impedance side port 152a and second high impedance side port 152b); first coupled line 154; second coupled line 155; low impedance side port pair 158 (including first low impedance side port 158a and second low impedance side port 158b); and crossing line 162 (including low impedance side circuit elements 164). By connecting crossing line 162, with its low impedance side circuit elements 164) across the pair of low impedance ports, coupler 150 will have a high impedance at its high impedance port pair 102, while maintaining a relatively lower impedance at its low impedance port pair 108. The low impedance side circuit elements are chosen so that the impedance will be transformed between high and low when the coupler operates in a coupling mode and/or in a splitting mode.

Figure 2:
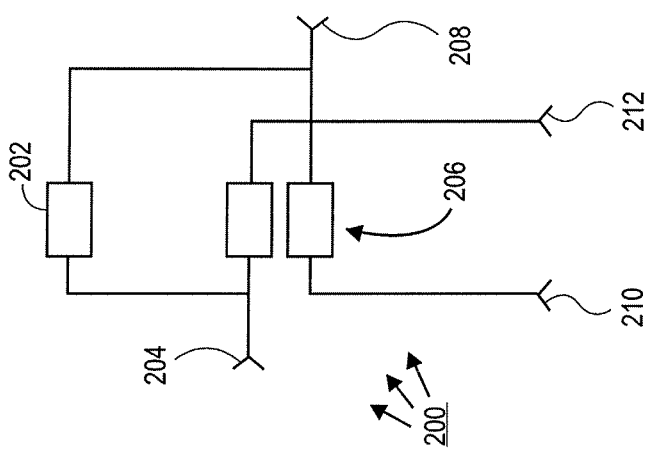
FIG. 2 is a schematic view of a third embodiment of a coupler according to the present invention.

As shown in FIG. 2, coupler 200 includes: first high impedance port 204; second high impedance port 208; first low impedance port 210; second low impedance port 212; coupled strip lines 206; and strip transmission line 202. In this example: (i) port 204 is rated at 50 ohms (zs); (ii) port 208 is rated at 50 ohms (zs); (iii) port 210 is rated at 25 ohms (zl); (iv) port 212 is rated at 25 ohms (zl); (v) the nominal operating frequency/wavelength of coupler 200 is in the radio frequency (RF) or microwave range; (vi) coupled strip lines 206 are formed as strip lines on a printed circuit board (PCB) substrate; (vii) coupled strip lines 206 are designed to have an even mode impedance (Ze) of 50,000 ohms; (ix) coupled strip lines 206 are designed to have an odd mode impedance (Zo) of 12.5 ohms; (x) transmission line 202 has an impedance (Zt) of 50 ohms; and (xi) transmission line 202 is one quarter wavelength of the nominal operating wavelength.

In the design of coupler 200, the crossing line is connected between the high impedance ports and the length of its transmission line is one quarter wavelength. Alternatively (or additionally), a crossing line could be placed across the low impedance ports. In this case the length of the strip transmission line between the low impedance terminals would be three-quarter wavelength.

In coupler 200, the impedance is transformed, by operation of the circuit, because of selection of the following parameters: (i) impedance of strip transmission line 202; (ii) even mode impedance (Ze) of coupled lines 206; and (ii) odd mode impedance (Zo) of coupled lines 206. As will be appreciated by those of skill in the art, these impedance parameters may be designed and controlled by controlling: (i) the dimensions of the strip lines; (ii) the spacing and/or dielectric between and around the coupled lines; and/or (iii) the relative spatial orientation of the coupled strip lines (for example, directly facing each other or partially offset). As will be seen by comparing coupler 200 with coupler 300, there is no exact formula for calculating transmission line impedance and couple mode impedances that will work in an operative, impedance-transforming coupler circuit. However, those of skill in the art will be able to determine and fine tune these impedance values, dependent upon specific application requirements.

Figure 3:
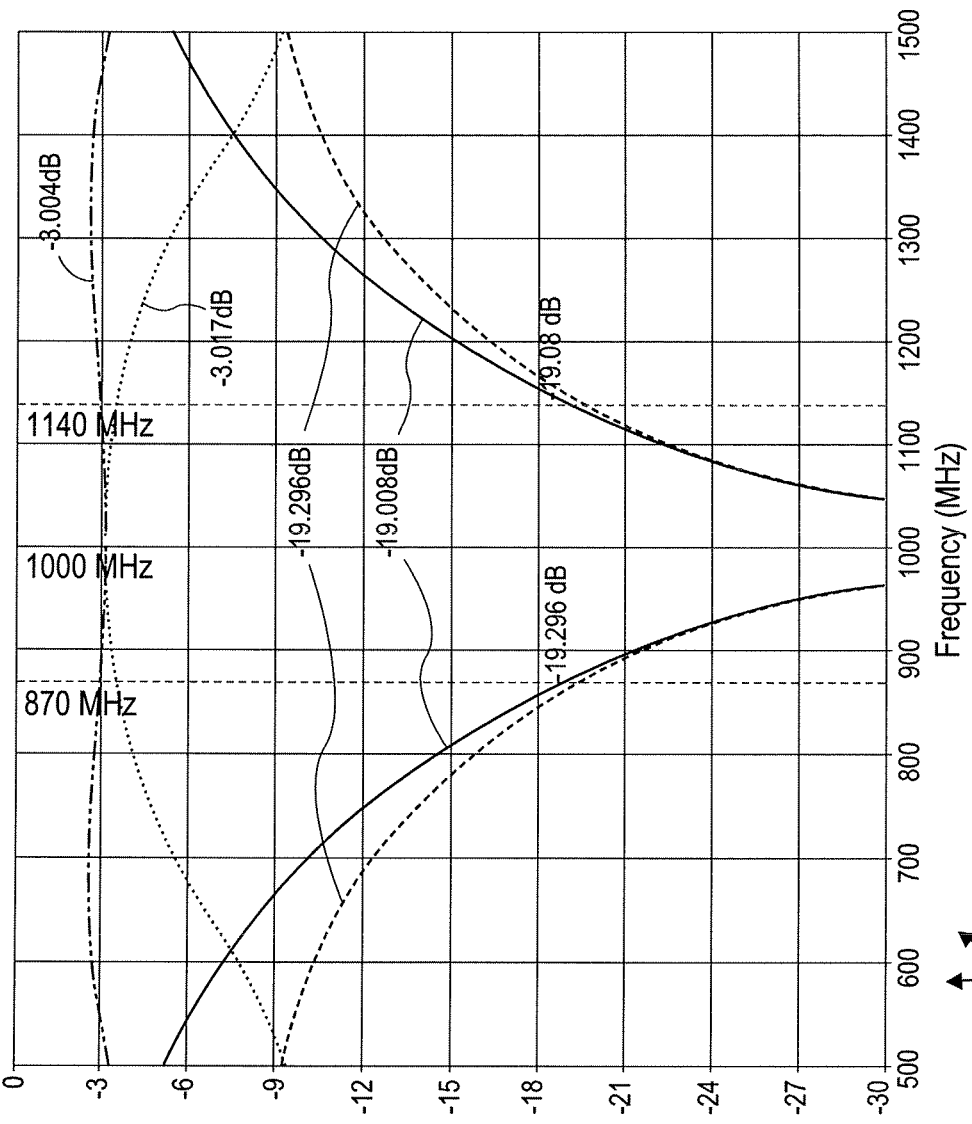
FIG. 3 is a graph showing certain performance characteristics of the third embodiment coupler.

As shown in FIG. 3, graph 201 shows some of the performance characteristics for coupler 200, based on the impedance values as set forth above.

Figure 4:
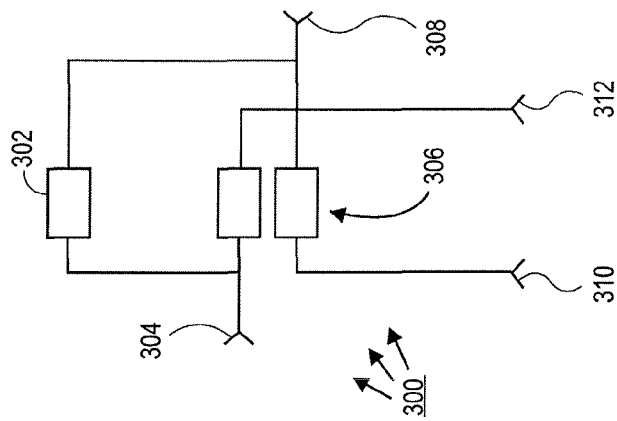
FIG. 4 is a schematic view of a fourth embodiment of a coupler according to the present invention.

As shown in FIG. 4, coupler 300 includes: first high impedance port 304; second high impedance port 308; first low impedance port 310; second low impedance port 312; coupled strip lines 306; and strip transmission line 302. In this example: (i) port 304 is rated at 50 ohms (zs); (ii) port 308 is rated at 50 ohms (zs); (iii) port 310 is rated at 25 ohms (zl); (iv) port 312 is rated at 25 ohms (zl); (iv) coupled strip lines 306 are designed to have an even mode impedance (Ze) of 275 ohms; (v) coupled strip lines 306 are designed to have an odd mode impedance (Zo) of 13 ohms; and (vi) transmission line 302 has an impedance (Zt) of 70 ohms.

Figure 5:
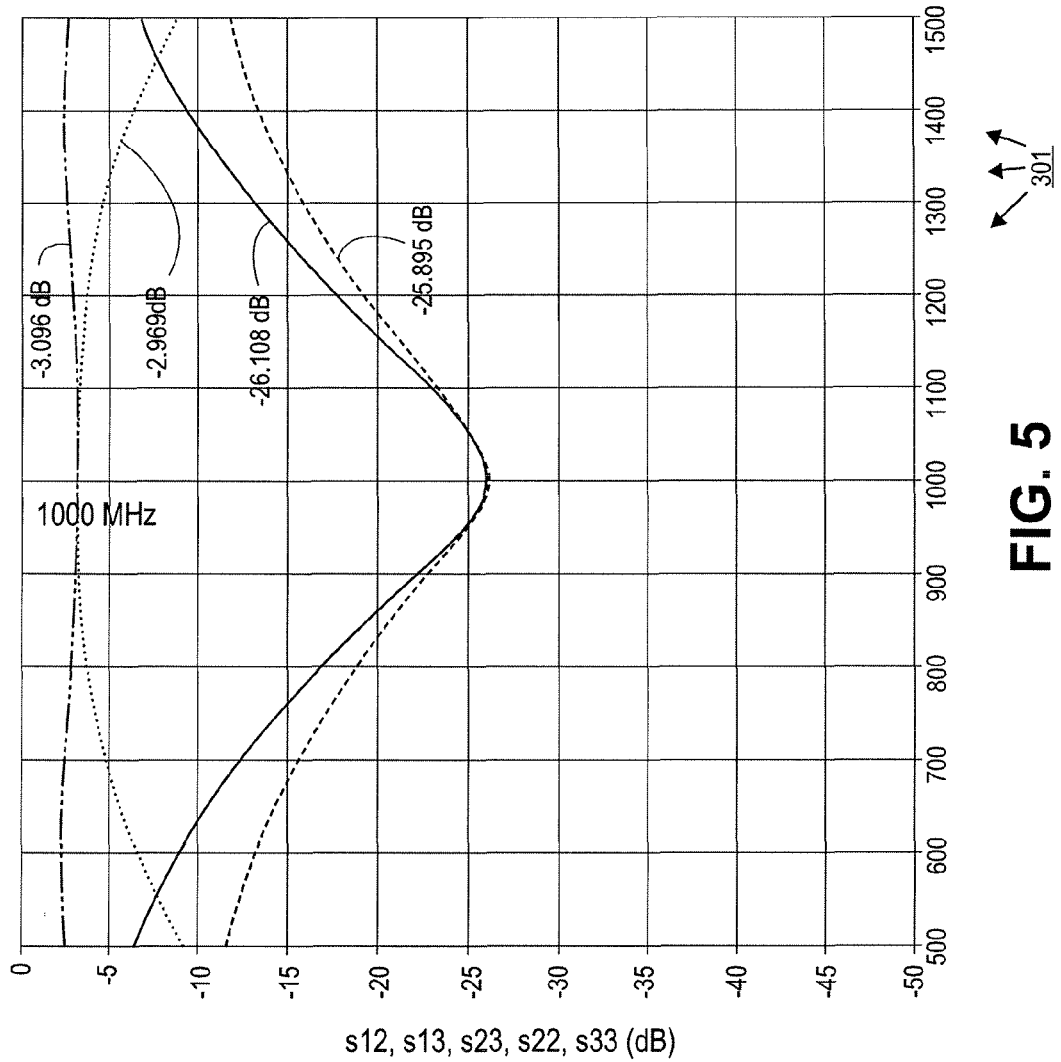
FIG. 5 is a graph showing certain performance characteristics of the FOURTH embodiment coupler.

As shown in FIG. 5, graph 301 shows some of the performance characteristics for coupler 300, based on the impedance values as set forth above. Note how performance has changed, relative to performance of coupler 200 shown in graph 201, because of the changes made to the characteristics of the coupled lines and the strip transmission line.

The coupled transmission lines (206 in coupler 200 and 306 in coupler 300) are of a quarter-wavelength long at center frequency and have the even and odd mode impedance of Ze and Zo. The third transmission line (line 202 in coupler 200 and line 302 in coupler 300) is also a quarter-wavelength long at center frequency and has the characteristic impedance of Zt. With transmission lines connected in described configuration, an impedance transforming coupler can be realized.

The design equations for 3 dB coupler with impedance transforming from Zs (port impedance of the high impedance port pair 204/208 and 304/308) to Zl (Port impedance port impedance of the low impedance port pair 210/212 and 310/312) are:

$$Zt = Zs/((Zs/Zl)-1);$$

Characteristic impedance of the coupled transmission lines:

$$Zc = (1/Zs^2 - 1/Zt^2)^{0.5}$$

Coupling value of the coupled transmission lines:

$c = (h^2/(1+h^2))^{0.5}$, where $h = Zc/Zl$

From Zc and c, the even and odd mode impedance of the coupled transmission lines are determined by the following equations:

$Ze = (Zc^2 * r)^{0.5}$ $Zo = (Zc^2/r)^{0.5}$; where $r = (1+c)/(1-c)$.

The impedance transforming range for this structure is:

$2 > Zs/Zl > 1$.

Design tradeoff between bandwidth and level of matching can be made by varying the Ze, Zo and Zt. FIGS. 4 and 5 show such a schematic variation and its resulting RF performance.

Various coupling value and impedance transforming ratio can be achieved by selecting corresponding Ze, Zo and Zt.

Figure 6:
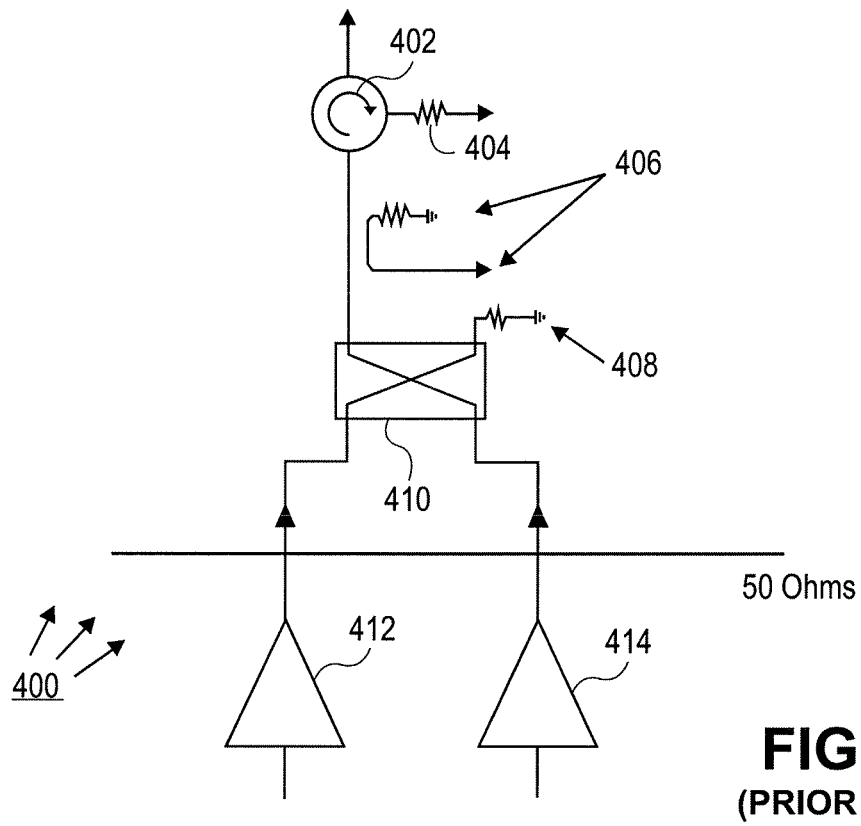
FIG. 6 is a schematic view of a power amplifier combining circuit using a prior art coupler.
Figure 7:
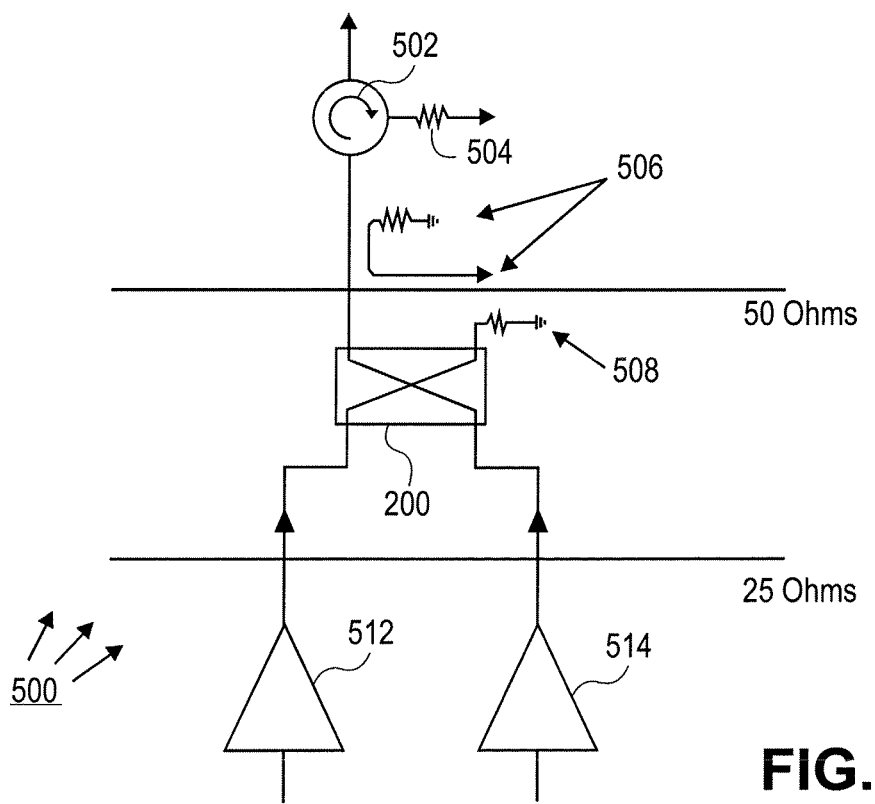
FIG. 7 is a schematic view of a first embodiment of a power amplifier circuit according to the present invention.
Figure 9:
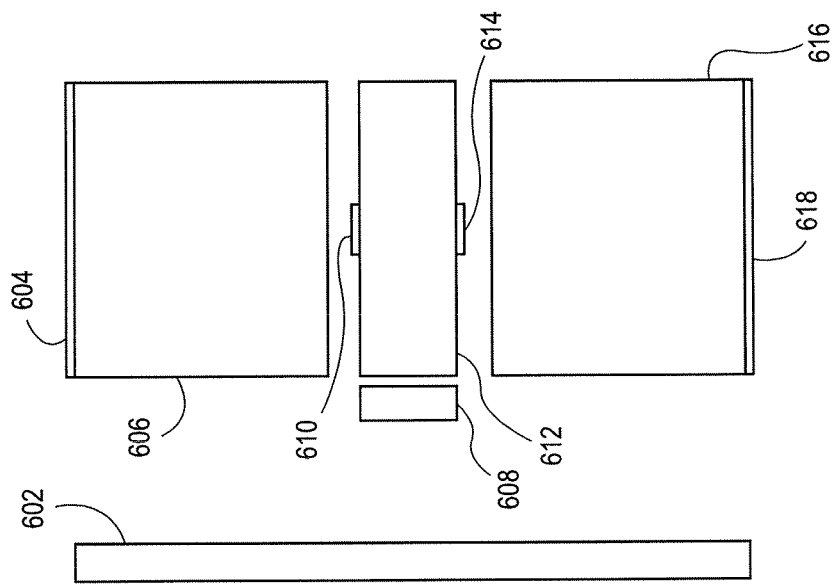
FIG. 9 is a cross-sectional view of a portion of the fifth embodiment coupler circuit (cross-hatching omitted for clarity of illustration purposes)

FIG. 6 shows prior art amplifier circuit 600 including: isolator 402, 404; forward power detector 406S; prior art, non-impedance transforming coupler 410; ground connection 408; first amplifier 412; and second amplifier 414. FIG. 7 shows a comparable amplifier circuit according to the present invention including: isolator 502, 504; forward power detector 506; impedance transforming coupler 200; ground connection 508; first amplifier 512; and second amplifier 514.

As shown in FIGS. 6 and 7, in a balanced power amplifier architecture, by taking part of the matching circuit inside the coupler, reducing the required impedance transform ratio in power amplifiers' output matching circuits, lower insertion loss can be achieved with the size and cost reduction.

3 dB is merely one example of a coupling value that may be used in circuitry according to the present invention. Exact design equation for coupling values that are not 3 dB may or may not exist. However, even if the exact ideal solution of the other coupling value in the structure does not exist, it would still be possible to do realistic designs by using compromise techniques as is known in the art of RF and microwave circuit design.

Regarding to the impedance transform ratio, in the design equations above, the realizable impedance transform ratio is:

$2 > Zs/Zl > 1$

However, because couplers according to the present invention can transform Zs to Zl from the high impedance port pair 204/208, 304/308 to the low impedance port pair 210/212, 310/312, it can also transform Zl to Zs from the low impedance port pair to the high impedance port pair, at least in preferred embodiments of the present invention that are structured to have the reciprocal property mentioned above. In other words, if the structure is rotated 180 degrees, the realizable impedance transform ratio becomes: $1 > Zs/Zl > 0.5$.

Figure 8:
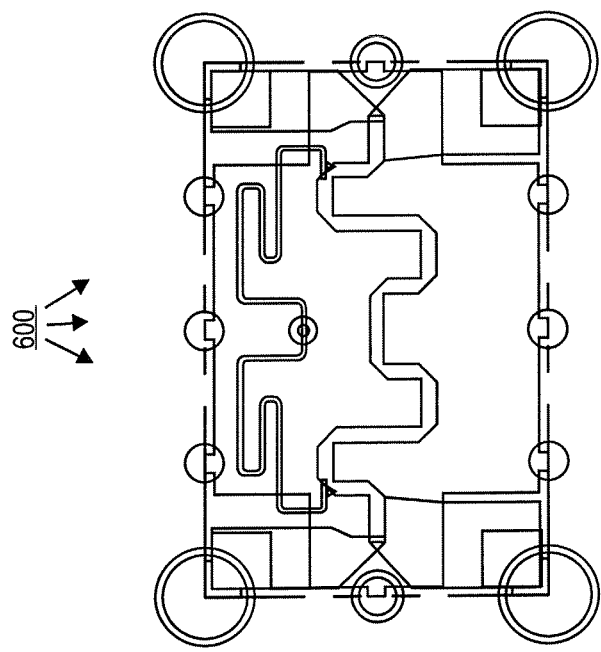
FIG. 8 is a plan view of a fifth embodiment of a coupler circuit according to the present invention.
Figure 10:
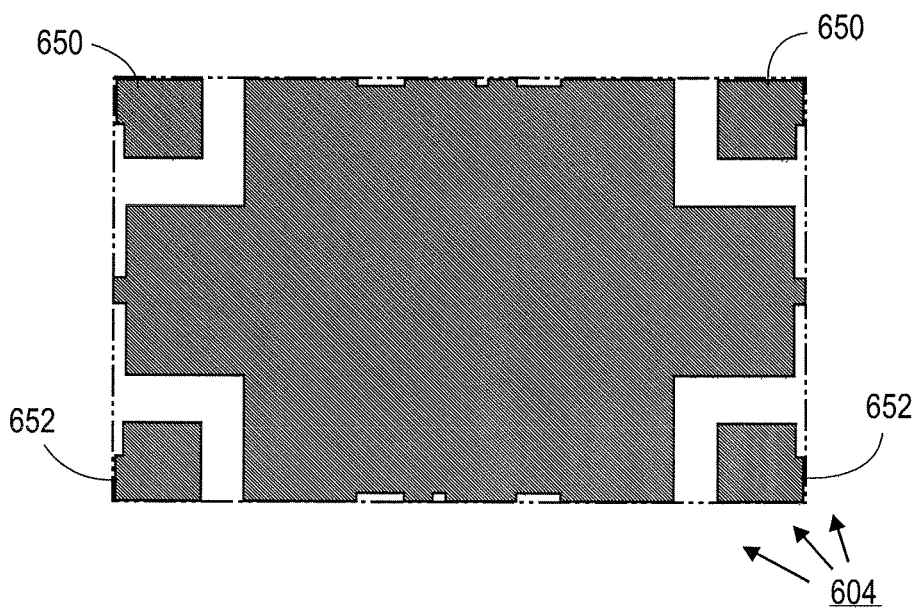
FIG. 10 is a plan view of a fourth metal layer of the fifth embodiment coupler.
Figure 11:
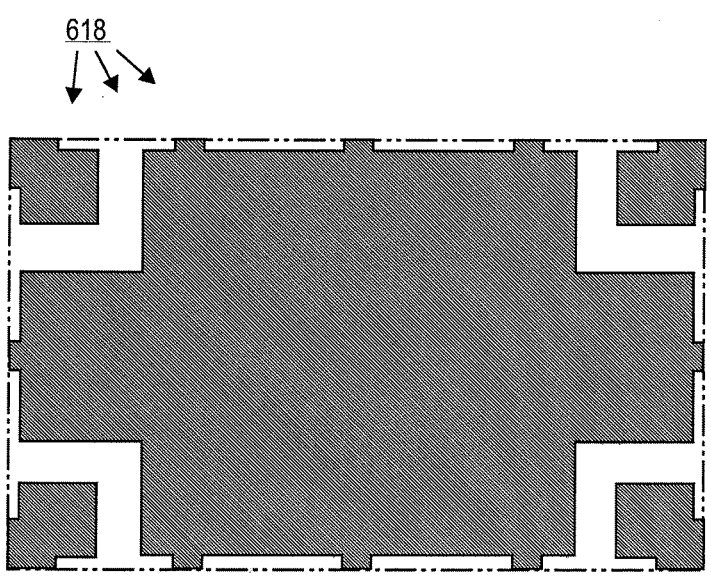
FIG. 11 is a plan view of a first metal layer of the fifth embodiment coupler.

Coupler 600 will now be discussed with reference to FIGS. 8 to 15. Coupler 600 is formed by printed circuit board techniques, using conventional printed circuit board lines, vias, ports, dielectric substrate boards, etc. As best shown in the partial cross-sectional view of FIG. 9, coupler 600 includes: second via set 602; fourth metal layer 604; third dielectric layer 606; first via set 608; third metal layer 610; second dielectric layer 612; second metal layer 614; first dielectric layer 616; and first metal layer 618; 50 ohm port pair 650; 25 ohm port pair 652; crossing line (including segments 654a, 654b, 654c); and coupled lines 656. FIG. 8 shows a plan view of the metal and via layers. FIGS. 10 to 15 respectively isolate each metal and via layer so that those of skill in the art will understand how embodiment 600 is constructed.

Figure 12:
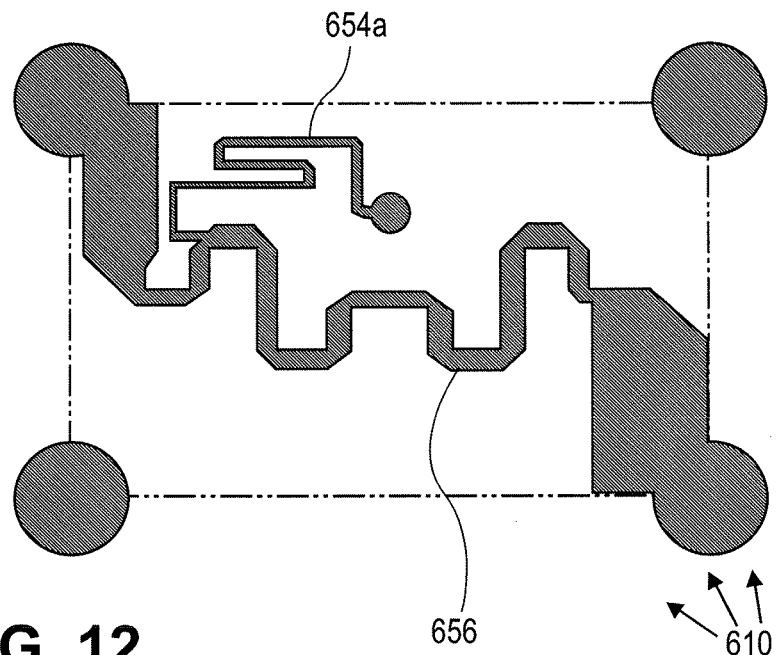
FIG. 12 is a plan view of a second metal layer of the fifth embodiment coupler.
Figure 13:
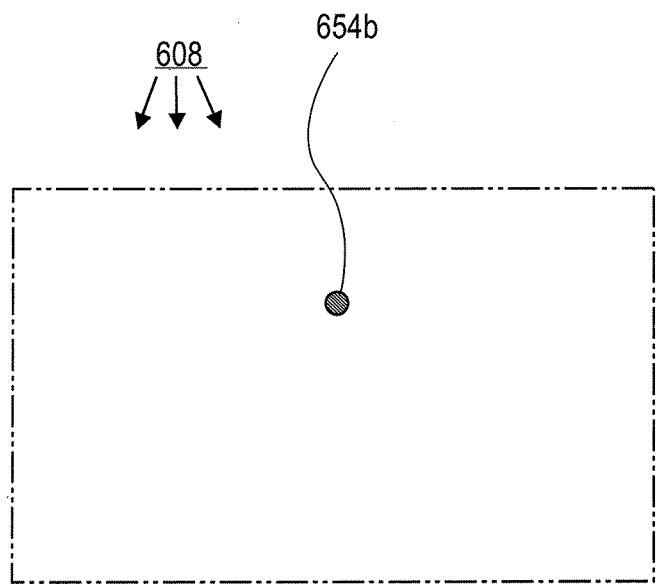
FIG. 13 is a plan view of a first via set of the fifth embodiment coupler.
Figure 14:
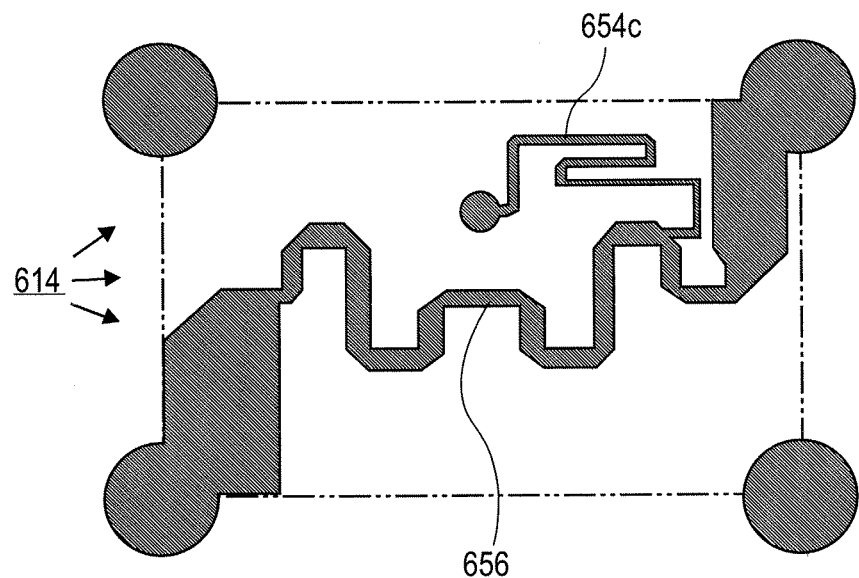
FIG. 14 is a plan view of a second metal layer of the fifth embodiment coupler.
Figure 15:
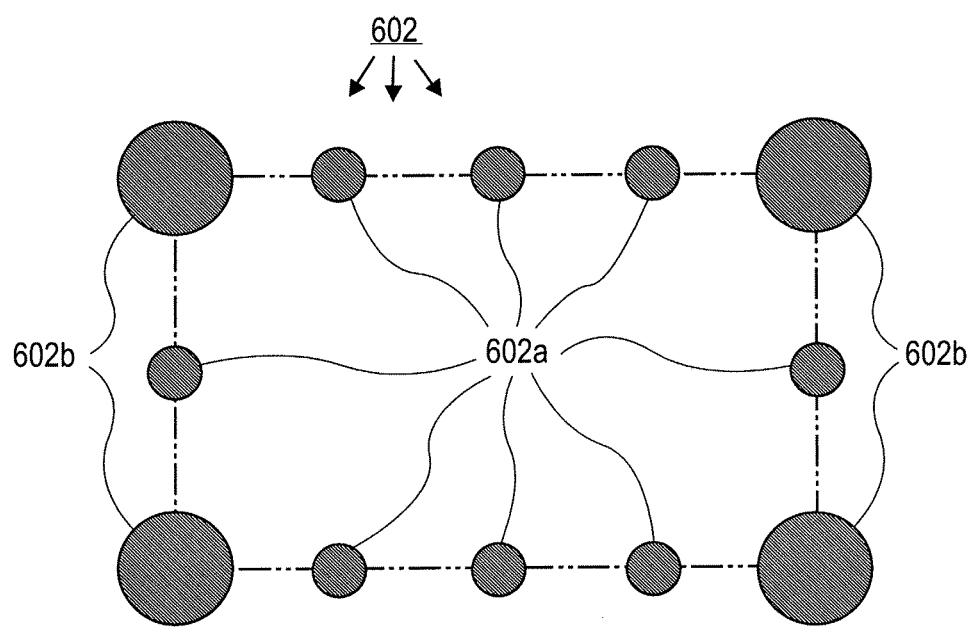
FIG. 15 is a plan view of a second via set of the fifth embodiment coupler.

As shown in FIGS. 12 and 14, the coupled lines are at the second and third metal layers (with the second dielectric layer interposed between the coupled lines). As shown in FIGS. 12, 13 and 14, the crossing transmission line is split between the second metal layer, the third metal layer and the first via set. As best shown in FIG. 15, the second via set: (i) joins the ground plane portion first and fourth metal layers together by vias 602a; and (ii) joins the first metal layer ports to the second and third metal layer coupler circuitry by vias 602b.

Figure 16:
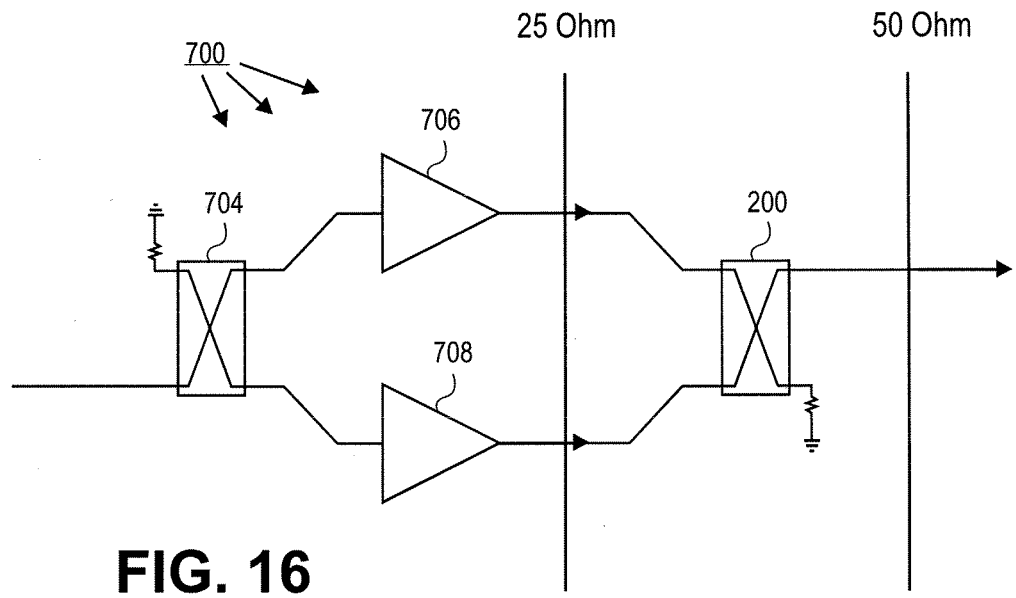
FIG. 16 is a schematic view of a second embodiment of a power amplifier circuit according to the present invention.

As shown in FIG. 16, one application for couplers according to the present invention is in a balanced power amplifier circuit 700. Circuit 700 includes: splitter 704; first 25 ohm amplifier 706; second 25 ohm amplifier 708; and impedance transforming coupler 200. In circuit 700, impedance transforming coupler 200 is used as a combiner, which means that the amplifiers can be matched at 25 ohms, instead of the conventional 50 ohms. This makes it easier to design amplifier output matching. Also, the matching network will generally have less insertion loss and wider bandwidth.

Figure 17:
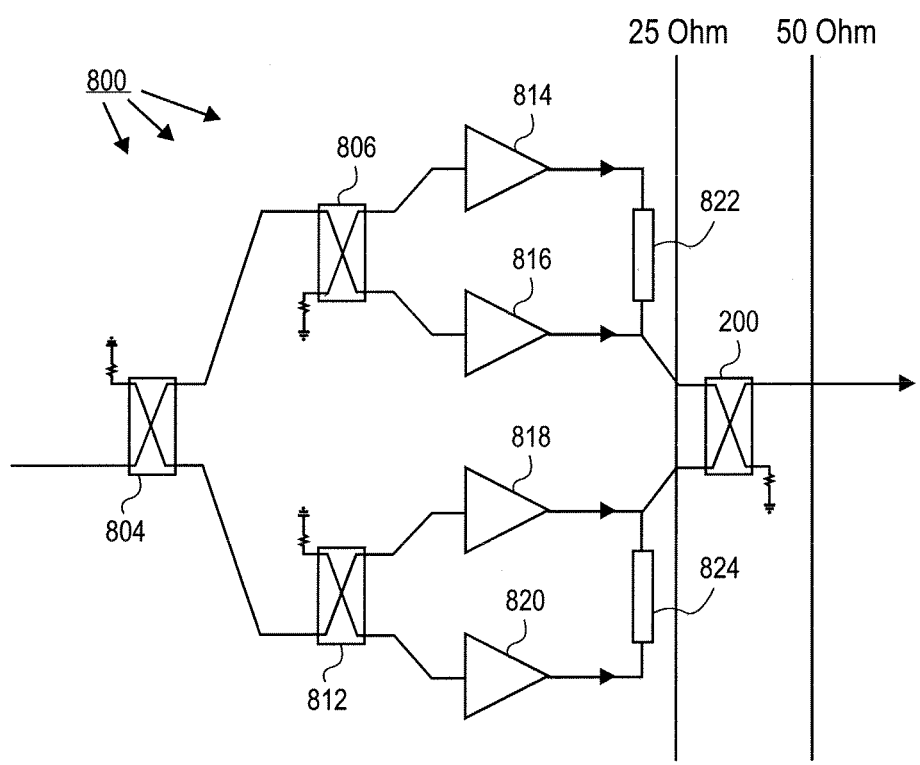
FIG. 17 is a schematic view of a third embodiment of a power amplifier circuit according to the present invention.

As shown in FIG. 17, another application for couplers according to the present invention is in a balanced dual Doherty power amplifier circuit 800. Circuit 800 includes: first splitter 804; second splitter 806; third splitter 812; first main amp 814; first peak amp 816; second peak amp 818; second main amp 820; quarter wavelength transmission strip lines 822 and 824; and impedance transforming coupler 200. This design has two fewer quarter wavelength strip lines, as compared to similar conventional balanced Doherty circuits, which saves space and decreases insertion loss.

DEFINITIONS

Any and all published documents mentioned herein shall be considered to be incorporated by reference, in their respective entireties, herein to the fullest extent of the patent law. The following definitions are provided for claim construction purposes:

Present invention: means at least some embodiments of the present invention; references to various feature(s) of the "present invention" throughout this document do not mean that all claimed embodiments or methods include the referenced feature(s).

Embodiment: a machine, manufacture, system, method, process and/or composition that may (not must) meet the embodiment of a present, past or future patent claim based on this patent document; for example, an "embodiment" might not be covered by any claims filed with this patent document, but described as an "embodiment" to show the scope of the invention and indicate that it might (or might not) covered in a later arising claim (for example, an amended claim, a continuation application claim, a divisional application claim, a reissue application claim, a re-examination proceeding claim, an interference count); also, an embodiment that is indeed covered by claims filed with this patent document might cease to be covered by claim amendments made during prosecution.

First, second, third, etc. ("ordinals"): Unless otherwise noted, ordinals only serve to distinguish or identify (e.g., various members of a group); the mere use of ordinals shall not be taken to necessarily imply order (for example, time order, space order).

Electrically Connected: means either directly electrically connected, or indirectly electrically connected, such that intervening elements are present; in an indirect electrical connection, the intervening elements may include inductors and/or transformers.

Receive/provide/send/input/output: unless otherwise explicitly specified, these words should not be taken to imply: (i) any particular degree of directness with respect to the relationship between their objects and subjects; and/or (ii)

absence of intermediate components, actions and/or things interposed between their objects and subjects.

Port: any structure capable of communicating an electronic signal between a coupler and a current carrier external to the coupler; some ports may be as simple as the termination of a wire or trace; other ports may be structured as printed circuit board pads or detachably attachable connectors (for example, a sub-miniature type A connector).

Unless otherwise explicitly provided in the claim language, steps in method steps or process claims need only be performed in the same time order as the order the steps are recited in the claim only to the extent that impossibility or extreme feasibility problems dictate that the recited step order be used. This broad interpretation with respect to step order is to be used regardless of whether the alternative time ordering(s) of the claimed steps is particularly mentioned or discussed in this document—in other words, any step order discussed in the above specification shall be considered as required by a method claim only if the step order is explicitly set forth in the words of the method claim itself. Also, if some time ordering is explicitly set forth in a method claim, the time ordering claim language shall not be taken as an implicit limitation on whether claimed steps are immediately consecutive in time, or as an implicit limitation against intervening steps.

What is claimed is:

1. A coupler circuit that operates at at least a nominal operating frequency, the coupler circuit comprising:
   a first port rated at a first impedance;
   a second port rated at the first impedance;
   a third port rated at a second impedance;
   a fourth port rated at the second impedance;
   a pair of coupled lines, comprising a first coupled line and a second coupled line; and
   crossing line circuitry having a crossing line impedance; wherein:
   the first coupled line has a first end and a second end;
   the second coupled line has a first end and a second end;
   the crossing line circuitry has a first terminal and a second terminal;
   the first and second coupled lines have a geometry and spacing so that, at the nominal operating frequency, the first and second lines act as coupled line pair having an odd mode impedance and an even mode impedance;
   the first port is electrically connected to: (i) the first end of the first coupled line, and (ii) the first terminal of the crossing line circuitry;
   the second port is electrically connected to: (i) the second end of the second coupled line, and (ii) the second terminal of the crossing line circuitry;
   the third port is electrically connected to the first end of the second coupled line;
   the fourth port is electrically connected to the second end of the first coupled line; and
   the odd mode impedance, the even mode impedance and the crossing line impedance are selected so that the coupler circuit transforms electrical signals, at the nominal operating frequency, between: (i) the first impedance, at the first and/or second ports, and (ii) the second impedance, at the third and/or fourth ports.

2. A coupler circuit that operates at at least a nominal operating frequency, the coupler circuit comprising:
   a first port rated at a first impedance;
   a second port rated at the first impedance;
   a third port rated at a second impedance;
   a fourth port rated at the second impedance;
   a pair of coupled strip lines, comprising a first coupled strip line and a second coupled strip line;
   crossing line circuitry including a strip transmission line and having a crossing line impedance;
   a dielectric substrate;
   wherein:
   the first coupled strip line has a first end and a second end;
   the second coupled strip line has a first end and a second end;
   the crossing line circuitry has a first terminal and a second terminal;
   the first and second coupled strip lines have a geometry and spacing so that, at the nominal operating frequency, the first and second strip lines act as coupled line pair having an odd mode impedance and an even mode impedance;
   the first port is electrically connected to: (i) the first end of the first coupled strip line, and (ii) the first terminal of the crossing line circuitry;
   the second port is electrically connected to: (i) the second end of the second strip coupled line, and (ii) the second terminal of the crossing line circuitry;
   the third port is electrically connected to the first end of the second coupled strip line;
   the fourth port is electrically connected to the second end of the first coupled strip line;
   the odd mode impedance, the even mode impedance and the crossing line impedance are selected so that the coupler circuit transforms electrical signals, at the nominal operating frequency, between: (i) the first impedance, at the first and/or second ports, and (ii) the second impedance, at the third and/or fourth ports; and
   the first and second coupled strip lines and the strip transmission line are printed on the substrate.

3. A coupler circuit that operates at at least a nominal operating frequency and nominal operating wavelength, the coupler circuit comprising:
   a first port rated at a high impedance;
   a second port rated at the high impedance;
   a third port rated at a low impedance;
   a fourth port rated at the low impedance;
   a pair of coupled lines, comprising a first coupled line and a second coupled line; and
   crossing line circuitry comprising a first terminal, a strip transmission line and a second terminal;
   wherein:
   the crossing line circuitry has a crossing line impedance;
   the strip transmission line is one quarter wavelength in length;
   the first coupled line has a first end and a second end;
   the second coupled line has a first end and a second end;
   the first and second coupled lines have a geometry and spacing so that, at the nominal operating frequency, the first and second lines act as coupled line pair having an odd mode impedance and an even mode impedance;
   the first port is electrically connected to: (i) the first end of the first coupled line, and (ii) the first terminal of the crossing line circuitry;
   the second port is electrically connected to: (i) the second end of the second coupled line, and (ii) the second terminal of the crossing line circuitry;
   the third port is electrically connected to the first end of the second coupled line;
   the fourth port is electrically connected to the second end of the first coupled line; and
   the odd mode impedance, the even mode impedance and the crossing line impedance are selected so that the coupler circuit transforms electrical signals, at the nominal operating frequency, between: (i) the high impedance, at the first and/or second ports, and (ii) the low impedance, at the third and/or fourth ports.

4. The circuit of claim 3 further comprises a first dielectric substrate, wherein the pair of coupled lines and the crossing line circuitry are printed on the first dielectric substrate.

5. The circuit of claim 4 wherein:
the dielectric substrate has two, opposing major surfaces; and
each of the coupled line of the pair of coupled lines is respectively printed on the opposite major surfaces of the first dielectric substrate.

6. The circuit of claim 5 wherein the crossing line circuitry is partially printed on each of the two, opposing major surfaces of the first dielectric substrate.

* * * * *